(12) United States Patent
Nicosia

(10) Patent No.: US 6,469,566 B2
(45) Date of Patent: Oct. 22, 2002

(54) PRE-CHARGING CIRCUIT OF AN OUTPUT BUFFER

(75) Inventor: Salvatore Nicosia, Palermo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/773,268

(22) Filed: Jan. 31, 2001

(65) Prior Publication Data

US 2001/0035786 A1 Nov. 1, 2001

(30) Foreign Application Priority Data

Jan. 31, 2000 (EP) .......................................... 00830068
May 22, 2000 (EP) .......................................... 00830368

(51) Int. Cl.[7] .......................................... H03K 17/04
(52) U.S. Cl. .......................... 327/374; 326/26; 326/27
(58) Field of Search ................................. 327/390, 536, 327/589, 157, 108, 112, 382, 374; 326/26, 27, 17

(56) References Cited

U.S. PATENT DOCUMENTS

| | | | | |
|---|---|---|---|---|
| 3,956,640 A | * | 5/1976 | Rubinstein ..................... | 326/87 |
| 5,559,990 A | | 9/1996 | Cheng et al. ................. | 395/484 |
| 5,596,539 A | | 1/1997 | Passow et al. .............. | 365/210 |
| 5,696,917 A | | 12/1997 | Mills et al. ................... | 395/401 |
| 5,835,999 A | * | 11/1998 | Grosspietsch et al. ...... | 327/328 |
| 5,966,724 A | | 10/1999 | Ryan ........................... | 711/105 |
| 6,198,340 B1 | * | 3/2001 | Ting et al. ................... | 327/536 |
| 6,212,095 B1 | * | 4/2001 | Chevallier ................... | 365/183 |

FOREIGN PATENT DOCUMENTS

| | | |
|---|---|---|
| EP | 0561370 | 9/1993 |
| EP | 0961283 | 12/1999 |

* cited by examiner

*Primary Examiner*—Tuan T. Lam
*Assistant Examiner*—Hiep Nguyen
(74) *Attorney, Agent, or Firm*—Lisa K. Jorgenson; Allen, Dyer, Doppelt, Milbrath & Gilchrist, P.A.

(57) ABSTRACT

A pre-charging circuit for the output node of an output buffer of an integrated digital system generates a first pulse for enabling the output of new data and a second pulse having a shorter duration than the first pulse for loading the new data in an output data register. The output data register is coupled to the input of the output buffer. A capacitor is connected in parallel to the load capacitance of the output node of the buffer by a pass-gate. The pass-gate is enabled by a pre-charge command corresponding to the logic AND of the second pulse and of the logic XOR of the new data and the data currently present on the output node. A driver is disabled by the first pulse for charging the capacitor to a voltage corresponding to the logic level of data belonging to the group that includes the new data and a logic inversion of the current data.

31 Claims, 2 Drawing Sheets

PRE-CHARGING CIRCUIT OF AN OUTPUT BUFFER

FIELD OF THE INVENTION

The present invention relates to output buffers of integrated digital systems, and, in particular, to a pre-charging circuit for speeding up the switching of an output buffer without inducing excessive switching noise on the supply lines of the integrated circuit.

BACKGROUND OF THE INVENTION

Many integrated digital systems processing and/or handling digital data streams are provided with one, or more often, with an array of output buffers for driving the lines of a data bus. The switching of an output buffer produces disturbances or switching noise that propagates through the power supply rails. Circuits upstream of the output buffers may be negatively conditioned by such a switching noise coming from the power supply rails of the integrated circuit, and may produce synchronization errors and/or spurious switching.

In fact, the supply voltage, commonly generated and regulated externally and applied to the integrated circuit (IC) may be subjected within the chip to variations due to internal resistive drops proportional to the absorbed current, and to inductive effects inversely proportional to the rise time of the step function of absorbed current. Both these effects contribute to the supply noise.

Switching noise is always present, but is particularly intense during the charging phase of new output data. In these phases each output buffer absorbs a relatively large current to charge the external load capacitance. This causes a noise spike that may slow down propagation of the signals inside the integrated circuit and/or cause errors.

An important example of such integrated systems are memory devices. A read cycle in a nonvolatile memory is characterized by pointing to a new memory location, reading the new data and outputting the new data. In standard memory devices the reading of the new data and the outputting of it takes place at different times. This effects the noise spikes and can be controlled in a relatively easy manner.

In contrast, in an interleaved memory the problem is more severe because each output buffer is slaved to distinct banks of the memory that alternately convey new read data. Through an internal common data bus, the control circuits of a bank transfer the new read data towards the output circuits, so the reading of the data may take place at the same time the previously read data (from a different bank) is being output. This makes the problems represented by the output switching noise more critical.

Naturally, a similar situation may be present in any integrated digital system in which there are two or more asynchronous sources of data that must be functionally conveyed. For example, in an interleaved manner, the data is conveyed towards a single output register driving a single buffer (serial output stream) or an array of buffers (parallel output stream).

The amplitude of the switching noise spikes can be reduced, according to a conventional technique, by limiting the maximum current absorbed by a buffer or an array of buffers while switching the output, but this approach slows down the speed of the system. Consequently, there is a need for a circuit that would allow for a reduction of the switching noise without sensibly incrementing the time of response of the integrated system.

SUMMARY OF THE INVENTION

In view of the foregoing background, it is an object of the present invention to provide a pre-charging circuit for an output buffer that, by varying the voltage on the load capacitance of the buffer in the time interval that precedes the loading in the output buffer of a new logic value different from the current one, realizes less abrupt transitions. This reduces the switching noise.

This and other objects, advantages and features are obtained by the pre-charging circuit that, immediately before the instant in which the new logic value is produced on the output node, connects an internal, pre-charged capacitor at a certain voltage, in parallel to the load capacitance of the output node of the buffer.

Therefore, the transition of the output data starts from an intermediate voltage level. In this way the amplitude of noise peaks is reduced because current peaks of reduced amplitude occur in the same switching time interval.

In particular, the pre-charging circuit preferably comprises an internal capacitance, and a pass-gate connected between the output node and the internal capacitance for connecting the internal capacitance in parallel to the load capacitance, and a driver connected to the internal capacitance for charging thereof to a voltage level between a voltage level of the new data and a voltage level of a logic inversion of current data being output.

The digital system may comprise an output data register connected to the output buffer. The digital system generates a first pulse for enabling output of the new data and a second pulse for loading the new data in the output data register. The second pulse may have a duration less than a duration of the first pulse.

The pre-charging circuit preferably further comprises a first pass-gate connected between the output data register and the output buffer for enabling output of the new data based upon the first pulse. The driver may be disabled based upon the first pulse.

The pre-charging circuit preferably further comprises a first logic gate having a first input for receiving the new data and a second input for receiving the current data being output, and a second logic gate having a first input for receiving the second pulse and a second input for receiving an output signal from the first logic gate. In one embodiment, the first logic gate may be an XOR logic gate, and the second logic gate may be an AND logic gate.

The pre-charging circuit preferably further comprises a recovery register connected to the driver, and a second driver connected to the recovery register and being disabled by the first pulse. The second driver is for charging the recovery register with the current data being output. The digital system preferably further comprises a multiplexer coupling an output of the recovery register to an input of the driver based upon an external command signal.

The digital system preferably further comprises a logic gate connected to the output buffer, wherein the logic gate enables the output buffer based upon a pair of external command signals.

BRIEF DESCRIPTION OF THE DRAWINGS

The different aspects and advantages of the invention will become clearer through the following detailed description of the invention and by referring to the attached drawings, in which.

DETAILED DESCRIPTION OF THE PREFERRED EMBODIMENTS

Switching noise spikes are reduced by a charge splitting technique between two capacitors establishing a predetermined pre-charge state of the capacitance of the output node of an output buffer at an intermediate voltage with respect to the full logic high and low levels. This reduces the amplitude of the peaks of current that are absorbed from the supply lines.

Figure 1:
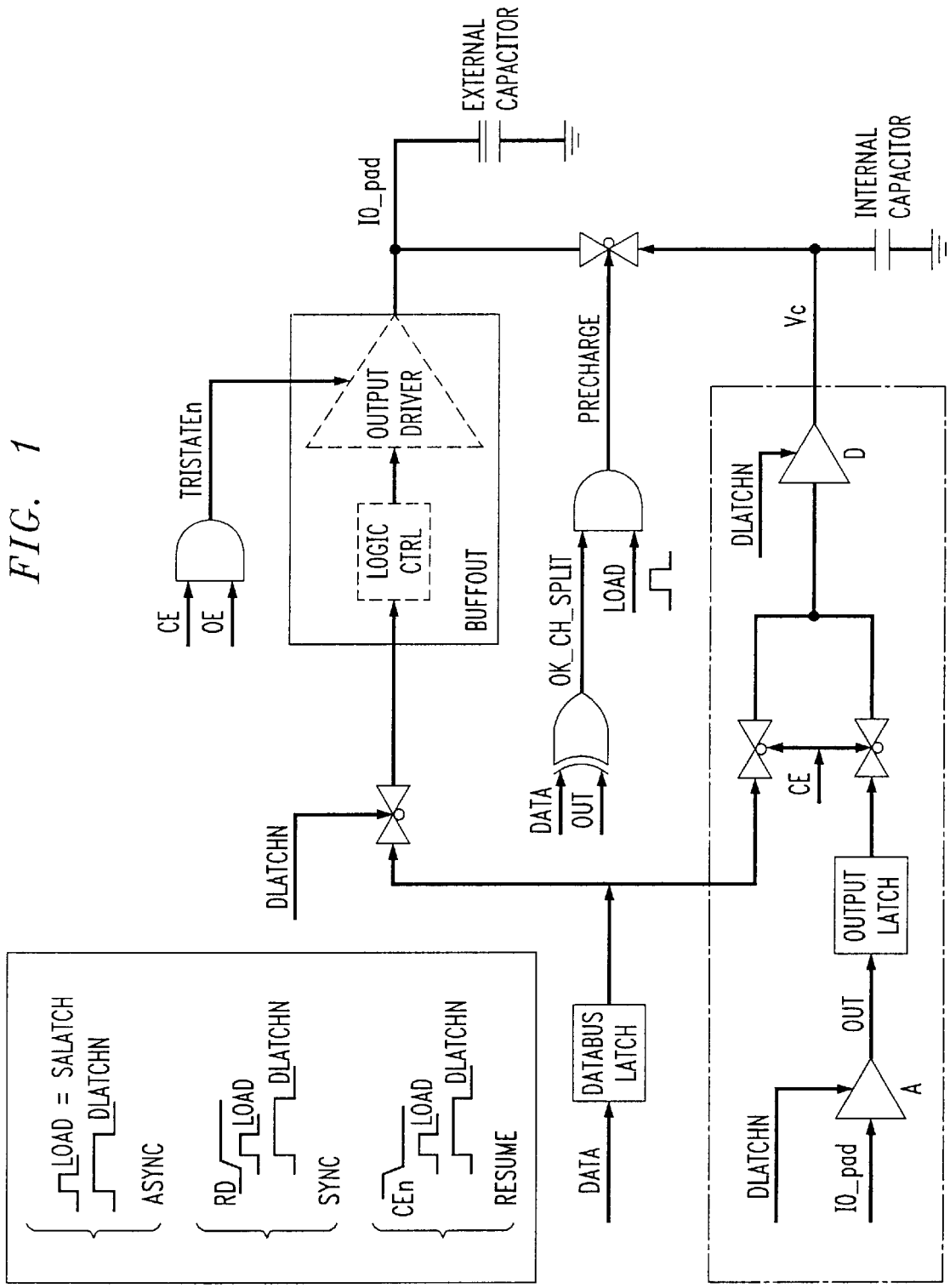
FIG. 1 is a simplified diagram of the output circuitry of an integrated system including the pre-charging circuit according to the present invention.

Because of their utility, memory devices are familiar to one skilled in the art, and the invention will be described in a greater detail by referring to the use of the circuit of the invention in a common memory device. A preferred embodiment of the output pre-charging circuit of the invention is depicted in FIG. 1. A circuit of the invention is associated to a respective output buffer BUFFOUT driving the output node IO_pad to which is associated a certain load capacitance EXTERNAL$_{13}$ CAPACITOR.

An output register DATABUS_LATCH drives the output buffer BUFFOUT through a pass-gate enabled by the command DLATCHN. Optionally, as in the considered application, the output buffer can be enabled/disabled by the logic AND of two protocol signals CE (chip enable) and OE (output enable) of the external system to which the memory device belongs.

The circuit of the invention is formed by the components depicted in FIG. 1. A timing diagram of a possible transition of the output buffer provided with the output pre-charging circuit of the invention is depicted in FIG. 2.

Figure 2:
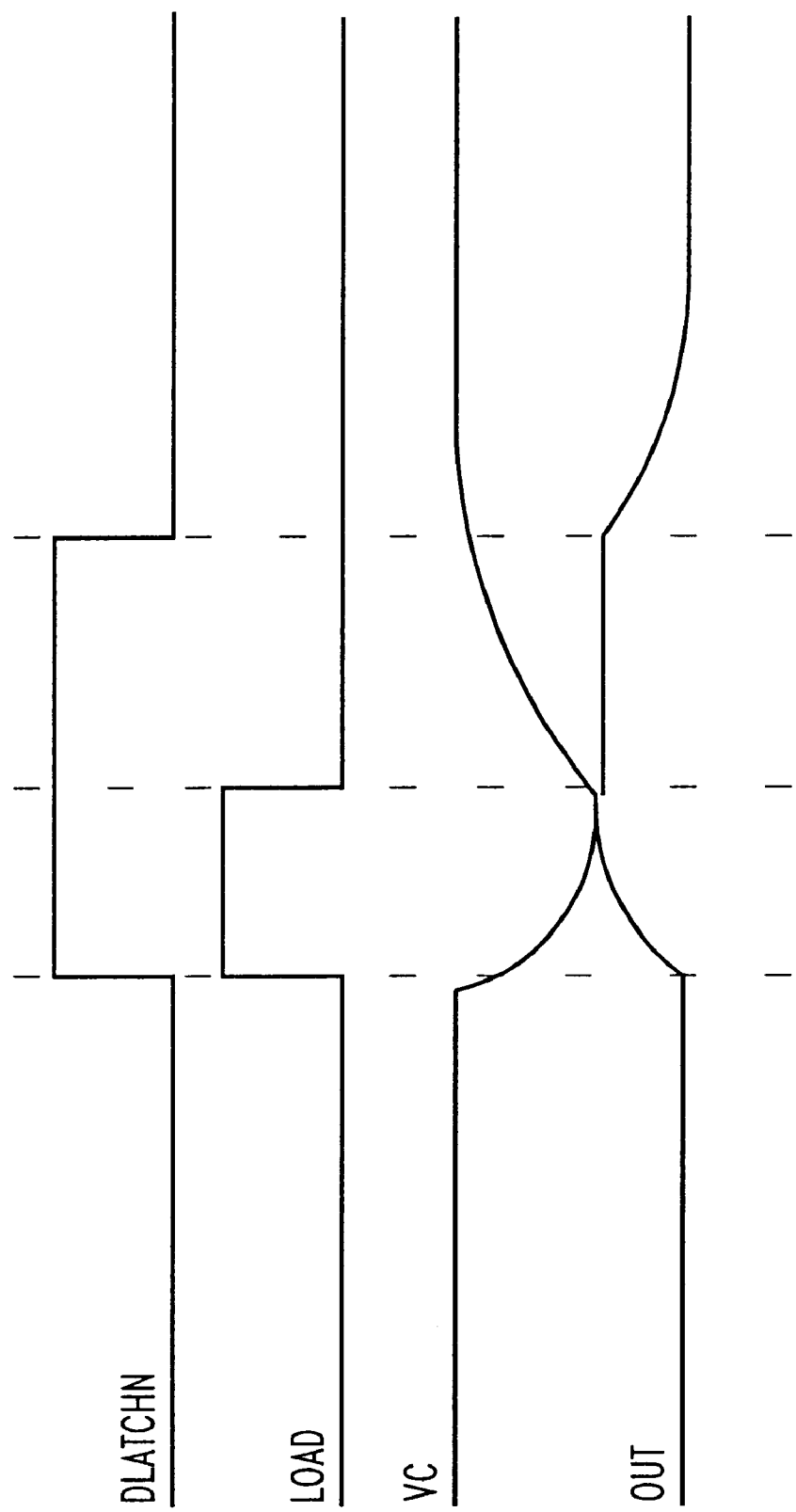
FIG. 2 are timing diagrams of the main signals of the integrated system illustrated in FIG. 1.

Every time new data is ready to be output, two signals LOAD and DLATCHN of different duration are generated, as illustrated in FIG. 2. The bit actually present on the output node IO_pad, i.e., the current logic state OUT, is compared to the new bit DATA to be output. If the two bits are different, then the signal OK_CH_SPLIT assumes its active value signaling that a switching of the logic state of the output node of the buffer is expected.

The LOAD signal is used for pre-charging the output capacitance only if the new bit value is different from the preceding one (OK_CH_SPLIT=1). Such a pre-charging is done only in the initial phase of the switching in order to bring the output node to an intermediate voltage level.

When the internal control circuit of the memory is signaling via the LOAD pulse that new data must be output, the enabling signal PRECHARGE enables the pass-gate. The internal capacitor INTERNAL_CAPACITOR is in parallel to the capacitor of the output node of the buffer EXTERNAL_CAPACITOR.

Therefore, the electric charge present on the internal capacitor INTERNAL_CAPACITOR pre-charges the output node to an intermediate voltage between the voltage value of the current data OUT and the voltage value of the new data DATA. At the same time the new data DATA propagates in the output buffer BUFFOUT.

As may be noticed by observing FIG. 2, after this pre-charge phase, the pulse LOAD ends. The signal PRECHARGE returns to a disabled state and the relative pass-gate is disabled to allow the buffer BUFFOUT to charge only the load capacitance of the output node.

According to a preferred embodiment of the invention, the voltage VC that charges the internal capacitor INTERNAL_CAPACITOR before the switching phase the buffer can be equal to the voltage corresponding to the new data to be made available on the output node, or to a logic inversion of the last data present on the output node. This function is carried out by the optional portion of the circuit bordered by the dashed line.

Given that during the phase in which the memory is ready to output new data DATA (i.e., while DLATCHN is disabled) it is necessary to pre-charge the internal capacitor. The signal DLATCHN can be used to disable the driver D that charges the INTERNAL_CAPACITOR and the driver A that updates the register OUTPUT_LATCH during the switching phase of the output.

The circuit of FIG. 1 has been designed to account for the case in which it is necessary to place temporarily in a tristate condition the output buffer BUFFOUT by the signal CE. If BUFFOUT is driving the output node IO_pad (CE is active), it is necessary to charge the internal capacitor with a voltage corresponding to the logic inversion of the current data. This prepares a future switching of the output voltage. In contrast, if the output buffer is in tristate (CE is active), then the internal capacitor must be pre-charged with a voltage corresponding to the new data DATA to be output upon re-activating BUFFOUT.

A multiplexer has been formed in FIG. 1 in the form of a pair of pass-gates, for example, which are controlled in phase opposition by the signal CE. The multiplexer selects the output of DATABUS_LATCH or the output of OUTPUT_LATCH depending on the value of CE.

If CE is disabled, i.e., the output of the buffer is tristated, the internal capacitor is pre-charged to the logic value of DATA taken at the output of the DATABUS_LATCH. Otherwise, the internal capacitor is pre-charged to a voltage corresponding to the logic inversion of the data OUT present on the output node IO_pad.

Therefore, even after a phase in which BUFFOUT is tristated, and during the subsequent resume phase, the data stored in the register DATABUS_LATCH can be output. When the BUFFOUT is tristated, the output bus cannot be managed by the memory and may be controlled by other devices of the system. Even in this situation, the signals LOAD and DLATCHN are generated and the system reacts in an analogous manner.

If the output buffer is not tristated, the pass-gate that selects the output of OUTPUT_LATCH inputting it to the driver D is enabled. This pre-charges the internal capacitor to a voltage corresponding to the opposite logic value of the output node, thus preparing for an eventual switching of the output.

In a different application, in which it is not necessary to manage a stand-by phase during which BUFFOUT must be tristated, and the relative resume phase of certain output data at the end of the stand-by phase, the circuit of the invention can be simplified because the internal capacitor must be pre-charged with a voltage corresponding to the logic inversion of the current output data. In this case the circuit of FIG. 1 may be simplified by eliminating the connection between DATABUS_LATCH and the driver D so that D is coupled only to the OUTPUT_LATCH.

Even in the case in which the output buffer should be disabled, the latter approach may still be used but it is less convenient with respect to the previously described one. This is due to the drawback of charging and discharging the internal capacitor even if BUFFOUT is tristated, which consumes power.

That which is claimed is:

1. A pre-charging circuit for an output node of an output buffer of a digital system that includes a load capacitance connected to the output node, the pre-charging circuit comprising:
   an internal capacitance;
   a pass-gate connected between the output node and said internal capacitance for connecting said internal capacitance in parallel to the load capacitance; and
   a driver connected to said internal capacitance for charging thereof to a voltage level of new data or to a voltage level of a logic inversion of current data being output.

2. A pre-charging circuit according to claim 1, wherein the digital system comprises an output data register connected to the output buffer; and wherein the digital system generates a first pulse for loading the new data in the output data register, and a second pulse for pre-charging the load capacitance when new data is different from preceding data.

3. A pre-charging circuit according to claim 2, wherein the second pulse has a duration less than a duration of the first pulse.

4. A pre-charging circuit according to claim 2, further comprising a second pass-gate connected between the output data register and the output buffer for enabling output of the new data based upon the first pulse.

5. A pre-charging circuit according to claim 2, wherein said driver is disabled based upon the first pulse.

6. A pre-charging circuit according to claim 2, further comprising:
   a first logic gate having a first input for receiving the new data and a second input for receiving the current data being output; and
   a second logic gate having a first input for receiving the second pulse and a second input for receiving an output signal from said first logic gate.

7. A pre-charging circuit according to claim 6, wherein said first logic gate comprises an XOR logic gate; and wherein said second logic gate comprises an AND logic gate.

8. A pre-charging circuit according to claim 2, wherein the digital system further comprises:
   a recovery register connected to said driver; and
   a second driver connected to said recovery register and being disabled by the first pulse, said second driver for charging said recovery register with the current data being output.

9. A pre-charging circuit according to claim 8, wherein the digital system further comprises a multiplexer coupling an output of said recovery register to an input of said driver based upon an external command signal.

10. A pre-charging circuit according to claim 9, wherein said multiplexer comprises a pair of pass-gates being enabled in phase opposition by the external command signal.

11. A pre-charging circuit according to claim 1, wherein the digital system further comprises a logic gate connected to the output buffer, and wherein the logic gate enables the output buffer based upon a pair of external command signals.

12. A digital system comprising:
   at least one output buffer having an output node for connecting to a load capacitance; and
   a pre-charging circuit connected to the output node and comprising
   an internal capacitance,
   a pass-gate connected between the output node and said internal capacitance for connecting said internal capacitance in parallel to the load capacitance, and
   a driver connected to said internal capacitance for charging thereof to a voltage level of new data or to a voltage level of a logic inversion of current data being output.

13. A pre-charging circuit according to claim 12, further comprising an output data register connected to said at least one output buffer; and wherein the digital system generates a first pulse for loading the new data in said output data register, and a second pulse for pre-charging the load capacitance when new data is different from preceding data.

14. A digital system according to claim 13, further comprising a second pass-gate connected between said output data register and said at least one output buffer for enabling output of the new data based upon the first pulse.

15. A digital system according to claim 13, wherein said driver is disabled based upon the first pulse.

16. A digital system according to claim 13, further comprising:
   a first logic gate having a first input for receiving the new data and a second input for receiving the current data being output; and
   a second logic gate having a first input for receiving the second pulse and a second input for receiving an output signal from said first logic gate.

17. A digital system according to claim 13, further comprising:
   a recovery register connected to said driver; and
   a second driver connected to said recovery register and being disabled by the first pulse, said second driver for charging said recovery register with the current data being output.

18. A digital system according to claim 17, further comprising a multiplexer coupling an output of said recovery register to an input of said driver based upon an external command signal.

19. A digital system according to claim 12, wherein the digital system further comprises a logic gate connected to said at least one output buffer, and wherein the logic gate enables said at least one output buffer based upon a pair of external command signals.

20. A digital system comprising:
   at least one output buffer having an output node for connecting to a load capacitance;
   an output data register connected to said at least one output buffer, the digital system generating a first pulse for loading the new data in said output data register, and a second pulse for pre-charging the load capacitance if new data is different from preceding data; and
   a pre-charging circuit connected to the output node and comprising
   an internal capacitance,
   a pass-gate connected between the output node and said internal capacitance for connecting said internal capacitance to the load capacitance, and
   a driver connected to said internal capacitance for charging thereof to a voltage level of new data or to a voltage level of a logic inversion of current data being output.

21. A digital system according to claim 20, wherein said pass-gate connects said internal capacitance in parallel to the load capacitance.

22. A digital system according to claim 20, further comprising a second pass-gate connected between said output data register and said at least one output buffer for enabling output of the new data based upon the first pulse.

23. A digital system according to claim 20, further comprising:

a first logic gate having a first input for receiving the new data and a second input for receiving the current data being output; and a second logic gate having a first input for receiving the second pulse and a second input for receiving an output signal from said first logic gate.

24. A digital system according to claim 20, further comprising:

a recovery register connected to said driver; and a second driver connected to said recovery register and being disabled by the first pulse, said second driver for charging said recovery register with the current data being output.

25. A method for pre-charging at least one output node of an output buffer of a digital system that includes a load capacitance connected to the output node, the method comprising:

connecting an internal capacitance in parallel to the load capacitance; and charging the internal capacitance to a voltage level of new data or to a voltage level of a logic inversion of current data being output.

26. A method according to claim 25, wherein the digital system comprises an output data register connected to the output buffer; and the method further comprises:

generating a first pulse for loading the new data in the output data register; and generating a second pulse for pre-charging the load capacitance when new data is different from preceding data.

27. A method according to claim 26, wherein the second pulse has a duration less than a duration of the first pulse.

28. A method according to claim 26, further comprising a first pass-gate connected between the output data register and the output buffer for enabling output of the new data based upon the first pulse.

29. A method according to claim 26, further comprising disabling a driver based upon the first pulse.

30. A method according to claim 26, further comprising:

performing a first logic function based upon the new data and the current data being output; and performing a second logic function gate based upon the second pulse and a result of the first logic function.

31. A pre-charging circuit according to claim 30, wherein the first logic function comprises an XOR logic function; and wherein said second logic function comprises an AND logic function.

* * * * *